(12) United States Patent
Keane

(10) Patent No.: US 8,736,479 B2
(45) Date of Patent: May 27, 2014

(54) REDUCING METASTABILITY IN ANALOG TO DIGITAL CONVERSION

(75) Inventor: John Patrick Keane, San Francisco, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/251,507

(22) Filed: Oct. 3, 2011

(65) Prior Publication Data
US 2013/0082854 A1   Apr. 4, 2013

(51) Int. Cl.
*H03M 1/12*  (2006.01)

(52) U.S. Cl.
USPC .......................................................... 341/155

(58) Field of Classification Search
USPC ................. 341/118, 120, 122, 159, 158, 155
See application file for complete search history.

(56) References Cited

U.S. PATENT DOCUMENTS

| | | | | |
|---|---|---|---|---|
| 6,308,140 B1* | 10/2001 | Dowling et al. | ................. | 702/60 |
| 6,707,411 B1* | 3/2004 | Poulton et al. | ................. | 341/155 |
| 6,812,880 B2* | 11/2004 | Paulus | ........................... | 341/164 |
| 6,915,237 B2* | 7/2005 | Hashemian | ................... | 702/183 |
| 7,627,435 B2* | 12/2009 | Corson et al. | .................... | 702/19 |
| 8,212,697 B2* | 7/2012 | Jansson et al. | ................. | 341/118 |
| 2010/0153041 A1* | 6/2010 | Doris | .............................. | 702/66 |
| 2011/0304489 A1* | 12/2011 | Christer et al. | ............... | 341/118 |

* cited by examiner

*Primary Examiner* — Peguy Jean Pierre

(57) ABSTRACT

A system for performing analog-to-digital conversion comprises a sampling unit that generates multiple digital samples from an analog input signal at each recurrence of a periodic interval, and a processing unit that combines the digital samples to produce a digital output signal. In certain embodiments, the sampling unit comprises multiple analog-to-digital converters arranged in parallel, and the processing unit comprises a digital signal processor that detects outliers in the digital samples and averages any non-outliers among the digital samples to generate the digital output signal.

16 Claims, 7 Drawing Sheets

REDUCING METASTABILITY IN ANALOG TO DIGITAL CONVERSION

BACKGROUND

An analog-to-digital converter (ADC) samples an analog signal at a periodic interval and converts each sample to a digital representation. The accuracy of the conversion is limited by the fundamental linearity of the converter, which is predictable and repeatable, and by noise, which fluctuates randomly in time. The noise causes a statistical variation of the ADC output about its mean value for a given input. This statistical variation is typically assumed to have a Gaussian probability distribution with a given standard deviation. The probability distribution determines the signal-to-noise ratio (SNR) of the conversion.

In addition to noise, many ADC architectures are also susceptible to the problem of metastability. For example, a metastability event may occur in an ADC where an internal comparator has insufficient time to resolve an internal voltage comparison to a digital 1 or 0 decision. Such a metastability event generally occurs where a voltage difference applied to the comparator is close to zero. Comparator metastability events can cause internal malfunctions in ADC operation, resulting in very large ADC errors. A large ADC error means that the digital output signal produced by the ADC has a significantly different value than the analog input signal it is supposed to represent.

Although metastability events may be rare, and so not significantly impact the overall average SNR of the converter, they may make the statistical distribution of the converter error non-Gaussian. In particular, they may cause the probability of a very large converter error to be much greater than one would expect for a given SNR when a Gaussian error distribution is assumed. This can be a serious problem in many applications, particularly in test and measurement equipment.

The probability of comparator metastability generally decreases exponentially with a ratio of a conversion time period to a time constant of the comparator. The time constant of the comparator can often be decreased at the cost of increased power consumption, but there is a limit to how small it can be made for a given process technology. In addition, the conversion time period can be increased for a given sample rate by interleaving multiple ADCs in time, with each ADC operating on one out of multiple input samples. This can cause problems however, when mismatch between these ADCs create periodic errors in the ADC output, referred to as interleave spurs.

SUMMARY

In a representative embodiment, a system for performing analog-to-digital conversion comprises a sampling unit and a processing unit. The sampling unit is configured to generate multiple digital samples from an analog input signal at each recurrence of a periodic interval, the sampling unit comprising multiple ADCs that operate in parallel to separately receive and digitize the analog input signal to produce the digital samples. The processing unit is configured to combine the digital samples to produce a digital output signal, and it determines when any of the digital samples is an outlier and averages digital samples that are not determined to be outliers.

In another representative embodiment, a method of performing analog to digital conversion comprises sampling and digitizing an analog input signal to generate multiple digital samples at each recurrence of a periodic interval, and combining the digital samples to generate a digital output signal, wherein combining the digital samples includes determining whether any of the digital samples is an outlier, and ignoring any outliers when generating the digital output signal.

In yet another representative embodiment, a system for performing analog-to-digital conversion comprises a sampling unit configured to generate multiple digital samples from an analog input signal at each recurrence of a periodic interval, the sampling unit comprising multiple analog-to-digital converters that operate in parallel to separately receive and digitize the analog input signal to produce the digital samples, and a processing unit configured to determine a median value of the digital samples and to output the median value as a digital output signal.

BRIEF DESCRIPTION OF THE DRAWINGS

The described embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION OF EMBODIMENTS

Figure 1:
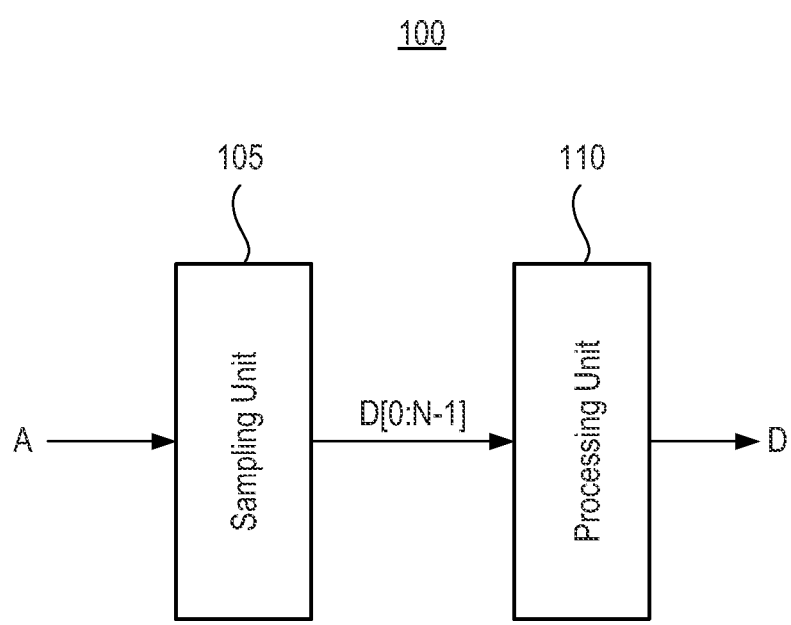
FIG. 1 is a block diagram of an ADC comprising a sampling unit and a processing unit according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. In addition, unless expressly so defined herein, terms are not to be interpreted in an overly idealized fashion.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

In general, the described embodiments relate to ADCs and related methods of operation. The term ADC refers broadly to any combination of features that function to convert an analog signal to a digital signal. This can include, for example, multiple ADCs combined with additional processing components to form a single larger ADC.

The described embodiments can be applied in virtually any context requiring analog to digital conversion. Moreover, certain embodiments are particularly useful for applications having a low tolerance for large errors. For instance, they can be useful for test and measurement equipment (e.g., real-time oscilloscopes) required to sample voltages with assurance that errors will never exceed a small fraction of the sampled voltages. As an example, some applications may allow an analog voltage of 0.5V to be digitized to a value of 0.501V or 0.499V (small errors of 0.2%), but not 0.6V or 0.4V (large errors of 20%). It should be noted that these error ranges are merely illustrative, and specific applications may require higher or lower levels of accuracy.

In certain embodiments, an ADC captures multiple samples of an analog input signal in parallel and then combines the samples to produce a digital output signal. For example, in some embodiments, these samples are captured by three ADCs that are arranged in parallel and operate on the same analog input signal. The three ADCs produce three digital output signals, which are compared to each other in a DSP. Under normal operating conditions, the three digital output signals will be similar to each other, so all three signals are combined (e.g., by averaging) to produce a single digital output signal. However, if one of the three digital output signals differs significantly from the other two signals, it is treated as an outlier and ignored, while the other two signals are combined to produce the single digital output signal.

Where the single digital output signal is produced by combining multiple (e.g., 2 or 3) digital output signals, the probability of a metastability error in the single digital output signal is the probability of a metastability event occurring simultaneously multiple ADCs operating on the same input sample. This probability is typically very low, so the single digital output signal is very unlikely to include a metastability error.

In general, metastability events in separate ADCs are assumed to be statistically independent, so the probability of an overall metastability error in the single digital output signal is the product of the probability of a metastability event in each of multiple ADCs. However, this assumption may be untrue in practice, as the behavior of the parallel ADCs may be correlated. Accordingly, in some embodiments, different voltage offsets can be intentionally added to the different ADC inputs, or the voltage offsets of their internal comparators can be adjusted, so that the probability of a simultaneous metastable event in multiple ADCs can be made even smaller. How this is done depends on the architecture of the ADC.

Although the cost of multiple ADCs is generally greater than the cost of a single ADC (e.g., greater area, power consumption, etc.), certain embodiments can nonetheless be implemented with a lower cost and better resolution than conventional high-resolution ADCs by exploiting certain design tradeoffs. For instance, certain embodiments use three low-cost, low-resolution ADCs to produce the digital output signal. These ADCs can have significantly smaller area and power consumption than a high-resolution ADC, so their combined cost can be less than or equal to that of a single high resolution ADC. Moreover, although these ADCs have low individual performance, their combined effect is to produce the digital output signal with high resolution by combining the outputs of more than one of the three ADCs.

The parallel ADC configuration avoids the interleave spurs problem of time-interleaved ADCs by averaging together the ADC outputs rather than operating in series. The overall gain and offset of the parallel ADCs are simply the average gain and offset of the individual ADCs. It may be useful to perform gain and offset calibration to make the gain and offsets of each ADC equal, however, as this minimizes the error when one ADC output must be discarded. In other words, it ensures that the gain and offset of the average of any selection of ADCs is the same as that of the average of all of the parallel ADCs. Note that resulting error in an output signal generated by averaging the valid outputs of the parallel ADCs may be non-Gaussian. Depending on the magnitude of a threshold value chosen to determine when two digital samples are so dissimilar that one should be discarded, large errors due to Gaussian noise may also be suppressed, as well as metastability events. For some applications, this may result in an overall improvement in system performance.

FIG. 1 is a block diagram of an ADC 100 according to a representative embodiment. In this embodiment, ADC 100 comprises a sampling unit 105 and a processing unit 110.

Sampling unit 105 receives an analog input signal A and captures multiple samples of signal A at each recurrence of a periodic interval T to produce N digital samples D[0:N−1]. Each digital sample D[0:N−1] comprises multiple bits (e.g., 10 bits) representing a digitized value of analog input signal A at the moment of sampling. For instance, if input signal A has a voltage of 5.0V, each digital sample D[0:N−1] should represent a value of about 5.0V.

As illustrated by FIGS. 2 and 5-7, sampling unit 105 can be implemented by a plurality of ADCs arranged in parallel and receiving the same analog input signal. However, it is not limited to any particular arrangement, number, or type of ADCs.

Processing unit 110 receives digital samples D[0:N−1] and analyzes the samples to determine whether any one of them is an outlier. An outlier is a sample that differs from other signals in some material respect. For instance, an outlier could be defined as a sample whose value differs from each of the other samples by at least a predetermined amount P. Alternatively, an outlier could be defined as a sample whose value differs cumulatively from the other samples by a predetermined amount P. Moreover, other distance functions or criteria could be used to identify one or more outliers. Outliers can occur for various reasons, such as metastability in different ADCs used to capture samples D[0:N−1], random noise, and others.

After identifying any outliers, processing unit 110 combines all of the digital samples D[0:N−1] that are not outliers (i.e., valid samples) to produce a single digital output signal D. The combination process typically comprises computing an average of the valid samples, such as a mean value or a median value. For example, if there are two valid samples, the average can be computed by simply adding together the values of the two samples and dividing the result by two. As an alternative to averaging the valid samples, processing unit 110 could simply select one of the valid samples as a representative sample and output the selected sample as the single digital output signal D. For instance, among three samples, processing unit 110 could select a sample having a middle value as the representative sample.

In addition to identifying outliers and combining valid samples, processing unit 110 can also implement a calibration scheme to correct systematic errors in the samples obtained from sampling unit 105. For instance, ADCs within sampling unit 105 may have minor gain mismatches. Accordingly, a first ADC may systematically produce samples with a larger value than a second ADC. Processing unit 110 can correct for these errors by performing a calibration process using analog input signals with known values, and then performing post processing corrections on digital samples D[0:N−1] according to the calibration. These corrections are typically performed before analyzing or combining digital samples D[0:N−1].

As illustrated by FIGS. 2 and 5-7, processing unit 110 can be implemented by a DSP. However, it is not limited to a DSP and could be implemented by other types of circuits or digital logic components, such as a central processing unit (CPU) or application specific integrated circuit (ASIC).

Figure 2:
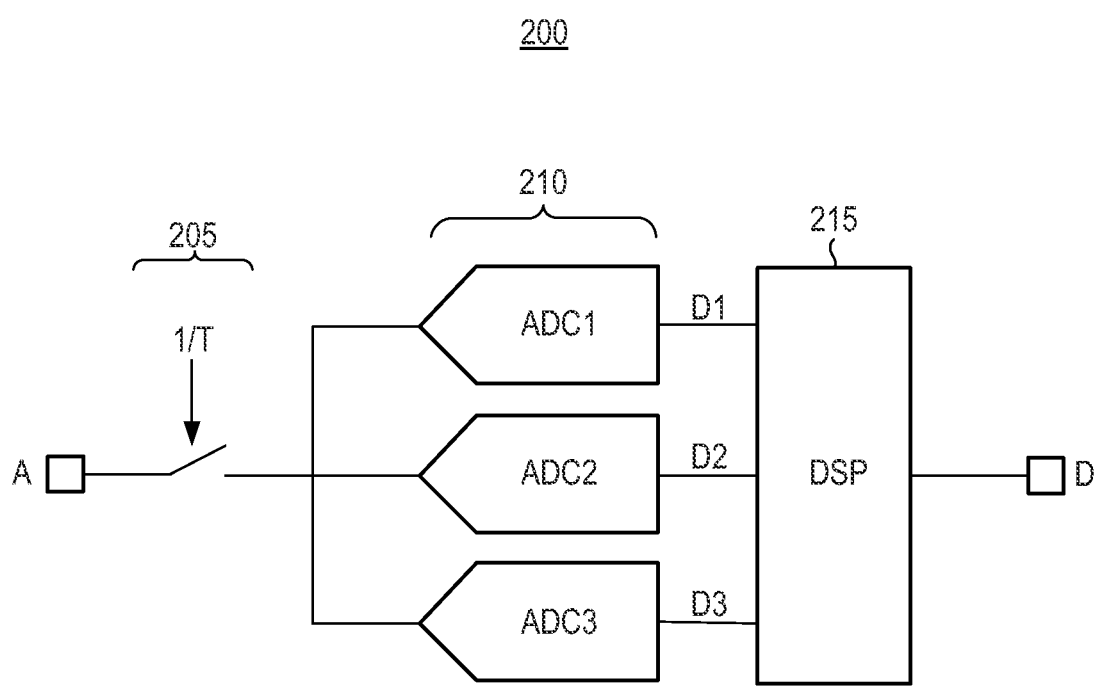
FIG. 2 is a block diagram of an ADC comprising a sampler, three ADCs, and a digital signal processor (DSP) according to a representative embodiment.

FIG. 2 is a block diagram of an ADC 200 according to a representative embodiment. In this embodiment, ADC 200 comprises a sampler 205, a plurality of ADCs 210, and a digital signal processor (DSP) 215.

Sampler 205 performs sampling on an analog input signal A at a periodic interval T, and transmits a resulting analog sample to each of ADCs 210. Sampler 205 typically comprises a sample and hold (S/H) circuit that holds the analog sample at a constant level for a predetermined time. The use of a shared S/H circuit ensures that there is no timing mismatch between ADCs 210, and they all receive the same sample.

ADCs 210 each convert the analog sample into a corresponding digital sample. In particular, they convert the analog sample into three digital samples D1, D2, and D3.

DSP 215 receives digital samples D1, D2, and D3 and determines whether any of these samples is an outlier. This can be accomplished, for example, by comparing the samples pairwise and designating a sample as an outlier if it differs from both of the other samples by at least a predetermined amount P. For example, if $|D1-D2|>P$ and $|D1-D3|>P$, then D1 is designated as an outlier. Similarly, if $|D1-D2|>P$ and $|D2-D3|>P$, then D2 is designated as an outlier. Likewise, if $|D2-D3|>P$ and $|D1-D3|>P$, then D3 is designated as an outlier.

After identifying any outliers, DSP 215 computes an average of the non-outlier samples (i.e., valid samples), and outputs the average as digital output signal D. For example, where sample D1 is designated as an outlier and samples D2 and D3 are non-outliers (i.e., $|D2-D3|\leq P$), digital output signal D is computed as $D=(D2+D3)/2$. Similarly, where sample D2 is designated as an outlier and samples D1 and D3 are non-outliers, digital output signal D is computed as $D=(D1+D3)/2$. Likewise, where sample D3 is designated as an outlier and samples D1 and D2 are non-outliers, digital output signal D is computed as $D=(D1+D2)/2$. Finally, if none of samples D1, D2, and D3 is designated as an outlier, digital output signal D is computed as $D=(D1+D2+D3)/3$. Because metastability errors are rare in most ADCs, all three of the digital samples will be used to compute digital output signal D most of the time. In addition, although rare, it is possible that one or fewer of the digital samples will be classified as a valid sample. In this case, DSP 215 can determine that an error has occurred.

In alternative embodiments, DSP 215 can use other algorithms to compute digital output signal D. For example, one possible alternative is to simply always pick the median value of digital samples D1, D2, and D3. This may be simpler to implement, but has less suppression of Gaussian noise than averaging.

In some embodiments, DSP 215 also performs gain and/or offset calibration before computing digital output signal D. This calibration can be used equalize the gain and offset of D1, D2 and D3, which minimizes the error when one of the ADC outputs is discarded due to a metastability event.

Figure 3:
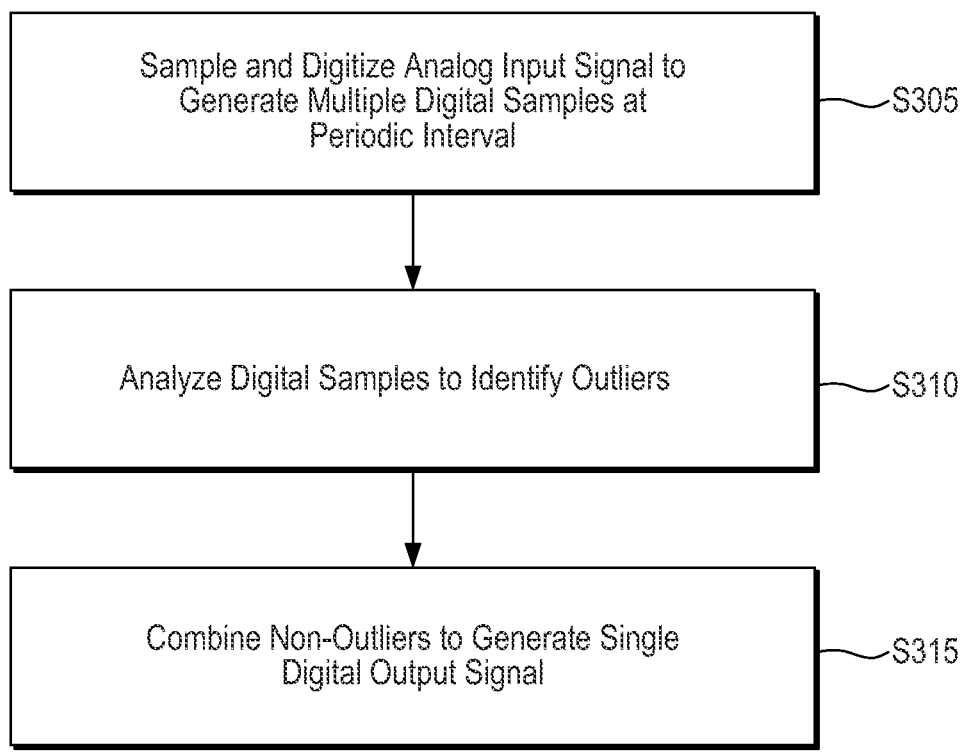
FIG. 3 is a flowchart illustrating a method of performing analog to digital conversion according to a representative embodiment.

FIG. 3 is flowchart illustrating a method of performing analog to digital conversion according to a representative embodiment. For explanation purposes, it will be assumed that the method is performed by ADC 100 of FIG. 1 or ADC 200 of FIG. 2. However, the method can be performed by various other ADCs, such as those described below with reference to FIGS. 5-7. In the description that follows, example method steps are indicated by parentheses.

Referring to FIG. 3, the method begins by sampling and digitizing an analog input signal to create multiple digital samples at a periodic interval (S305). This can be performed, for example, by sampling unit 105 or sampler 205 and ADCs 210. Next, the digital samples are analyzed to identify outliers (or alternatively, valid samples) (S310). This can be performed, for instance, using an algorithm such as that described above in relation to FIG. 2. After the outliers have been identified, the method combines non-outliers to generate a single digital output signal (S315). The outliers are typically combined using an averaging function such as that illustrated in FIG. 2.

Figure 4:
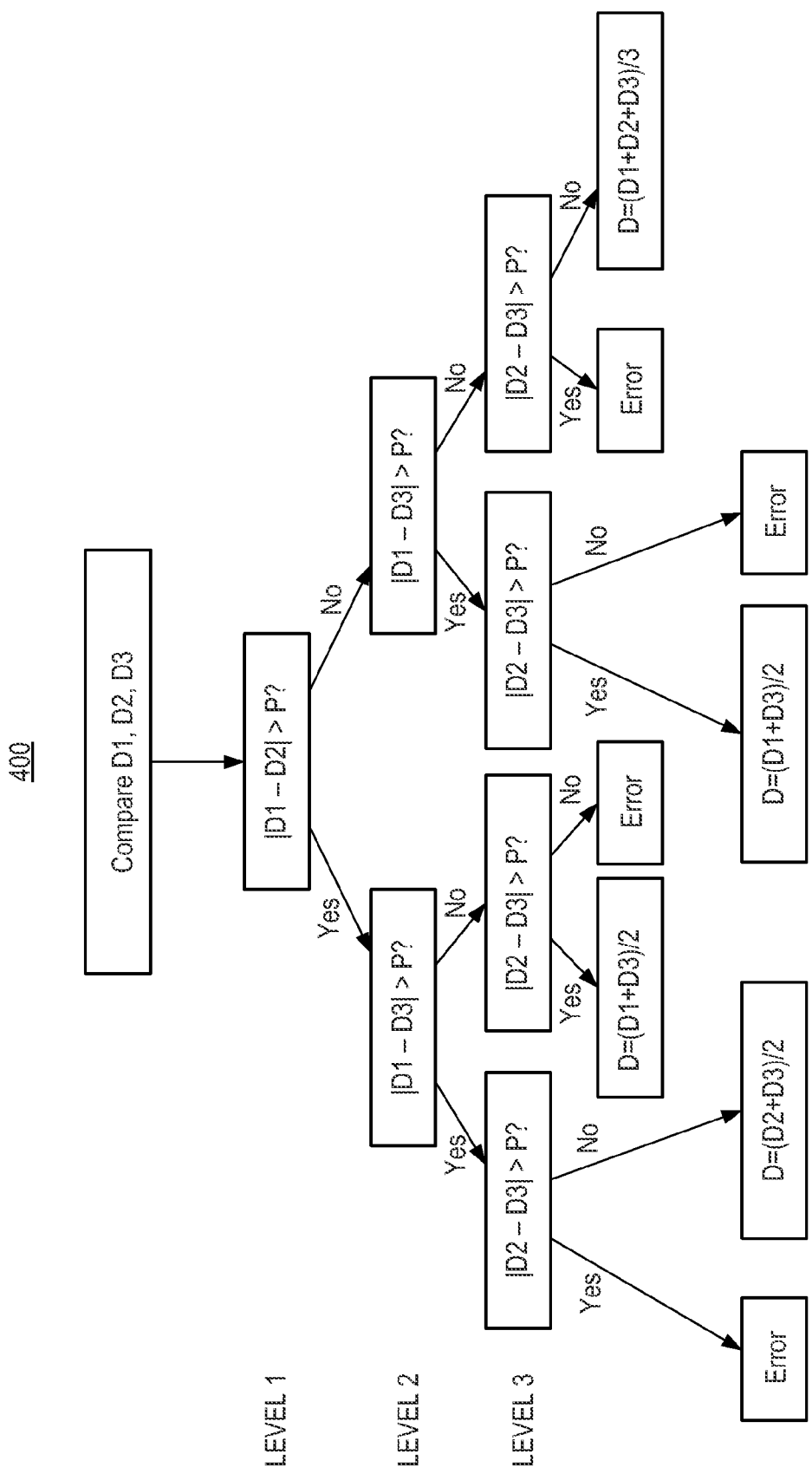
FIG. 4 is a decision tree illustrating a method of computing a digital output signal during analog to digital conversion according to a representative embodiment.

FIG. 4 is a decision tree 400 illustrating an algorithm used to perform analog to digital conversion in accordance with a representative embodiment. The algorithm of FIG. 4 is similar to that described above in relation to FIG. 2, but it is not limited to being performed by ADC 200 of FIG. 2. Moreover, none of the described embodiments is limited to using a decision tree to perform combine digital samples. Rather, the decision tree is merely provided to show possible combinations of digital sample values.

Referring to FIG. 4, decision tree 400 has first through third levels labeled LEVEL 1 through LEVEL 3. In the first level, decision tree 400 determines whether the difference between digital samples D1 and D2 is greater than the predetermined amount P. In the second level, it determines whether the difference between digital samples D1 and D3 is greater than the predetermined amount P. In the third level, it determines whether the difference between digital samples D2 and D3 is greater than the predetermined amount P. Based on the outcomes at each of these levels, the digital output signal D is computed by one of various equations shown in FIG. 4, or an error occurs. As indicated in the description of FIG. 2 above, the most likely scenario is that each of the digital samples is a valid sample, so digital output signal D is usually computed as $D=(D1+D2+D3)/3$. The least likely scenario is an error because it generally requires a metastability event in multiple ADCs, which is rare.

Each of the error events in FIG. 4 indicates that digital samples D1 through D3 differ substantially, but it is not clear whether any of them is an outlier. These error events can be handled, for example, by simply averaging together digital samples D1 through D3, but flagging the resulting digital output signal D as unreliable. This flagging can be accomplished, for instance, using an error signal E shown in FIG. 7.

Figure 5:
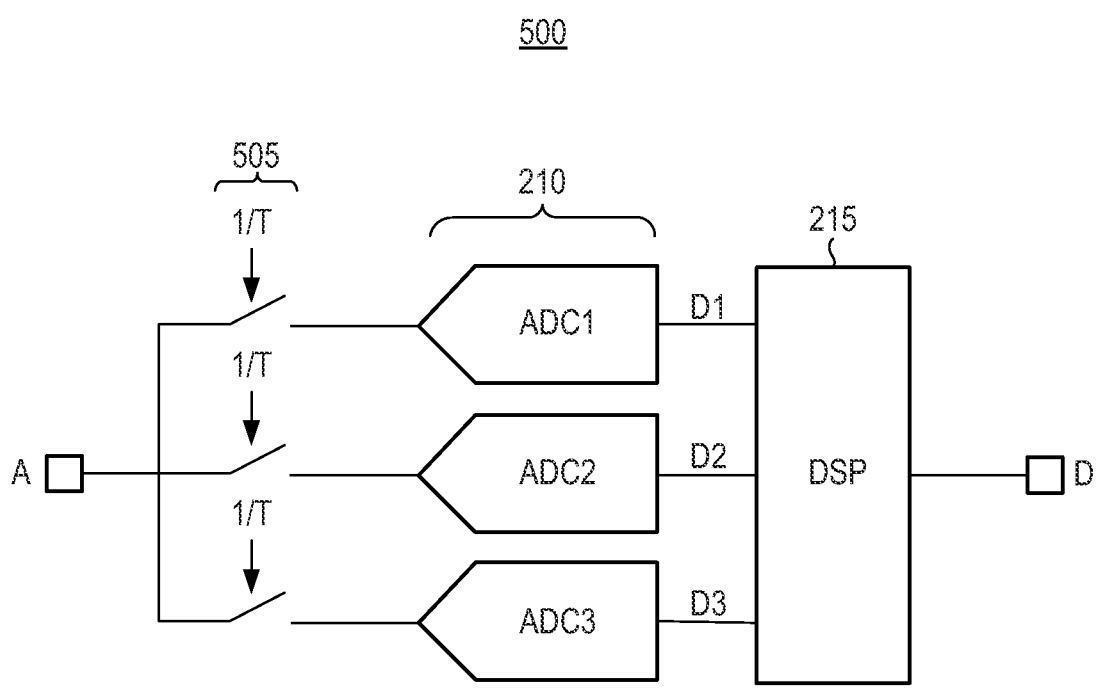
FIG. 5 is a diagram of an ADC comprising three samplers, three ADCs, and a DSP according to a representative embodiment.

FIG. 5 is a block diagram of an ADC 500 according to a representative embodiment. ADC 500 is similar to ADC 200 of FIG. 2, except that sampler 205 is replaced with a plurality of samplers 505.

Each of samplers 505 comprises an S/H circuit connected to a corresponding one of ADCs 210. This configuration may be easier to implement than the configuration of FIG. 2, depending on context. However, it may introduce errors due to timing skew.

Ideally, each of samplers 505 performs sampling at the same time. However, there may be some timing mismatch due to clock skew and device mismatches in the sampling network. In this case, any timing skew between the channels will cause some low-pass filtering of the digital output signal D as averaging time-shifted versions of the same signal corresponds to a finite-impulse-response (FIR) low-pass filter. For typical expected timing skews, this filtering action is likely to be small. However, if large timing skews are expected, some timing correction may be (performed, either in DSP 215, or by adjusting delays in the sampling clock network, to minimize the errors that will result when one of the ADC outputs is discarded due to a metastability event. Any uncorrelated jitter between the sampling paths will be averaged out, which may reduce the power and area requirements of the separate samplers to a level approaching that of a single sampler solution. Gaussian errors due to uncorrelated jitter may also be converted to non-Gaussian errors with reduced probability of large errors.

Figure 6:
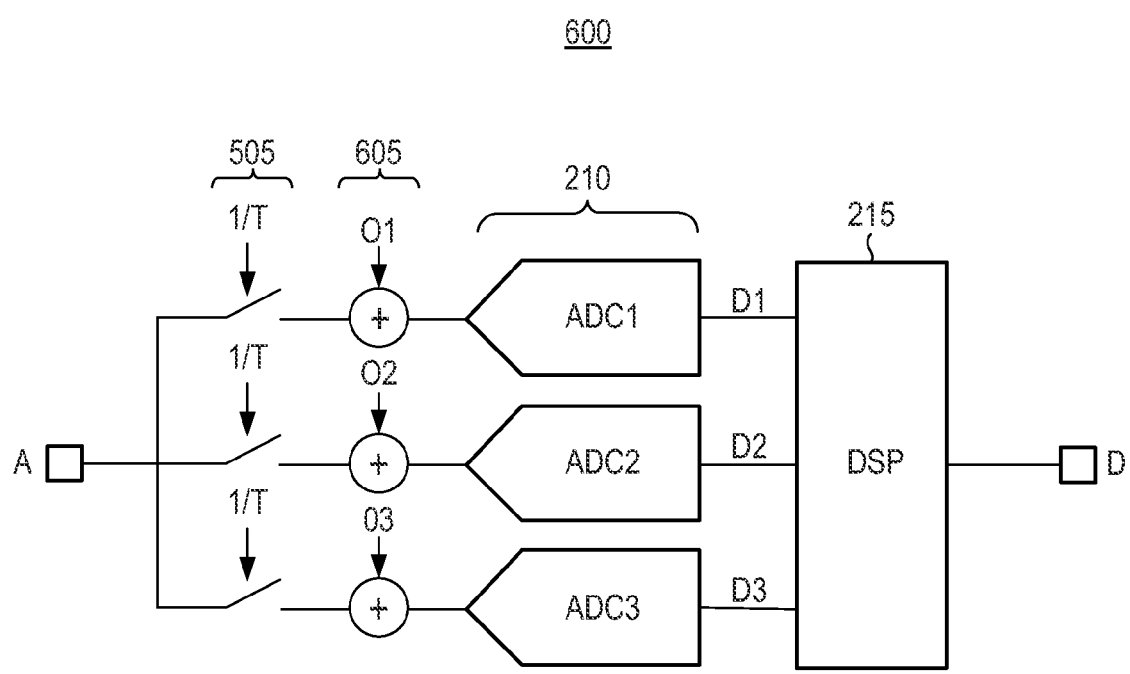
FIG. 6 is a diagram of an ADC comprising three samplers, three offset circuits, three ADCs, and a DSP according to a representative embodiment.

FIG. 6 is a block diagram of an ADC 600 according to a representative embodiment. ADC 600 is similar to ADC 500, except that it further comprises offset circuits 605 that introduce amplitude offsets O1 through O3 into the respective sampled input signals provided to ADCs 210. For example, one of the offset circuits 605 could introduce a 2 millivolt (mV) offset into one of the input signals to change it from 0.5V to 0.498V, and another of the offset circuits 605 could introduce a −2 mV offset into another one of the input signals to change it from 0.5V to 0.502V.

The offsets O1 through O3 are generally chosen to minimize the likelihood of metastability events occurring simultaneously in two ADCs. The offsets may be beneficial because a simultaneous metastability event is more likely to occur in two nearly identical ADCs with substantially identical inputs than in the same ADCs with input offsets.

The offsets can be added to the input signals as shown in FIG. 6, or alternatively they can be added to comparators within ADCs 210. The values of the offsets can be set by using a calibration procedure to evaluate the thresholds of the internal ADC comparators and adjust the offsets O1, O2, and O3 so that the thresholds of the ADCs are different, at least for the most significant bits.

As an alternative to (or in addition to) adding offsets to the analog input signals, different voltage offsets could be applied to internal comparators of the ADCs. Like the voltage offsets of the analog input signals, these offsets can reduce the probability of more than one ADC having a metastability error at the same time. In other words, these different offsets reduce the correlation between the probabilities of metastability errors in different ADCs. In addition to the above described voltage offsets, other methods can be similarly used to reduce the correlation between the probabilities of metastability errors in different ADCs.

Figure 7:
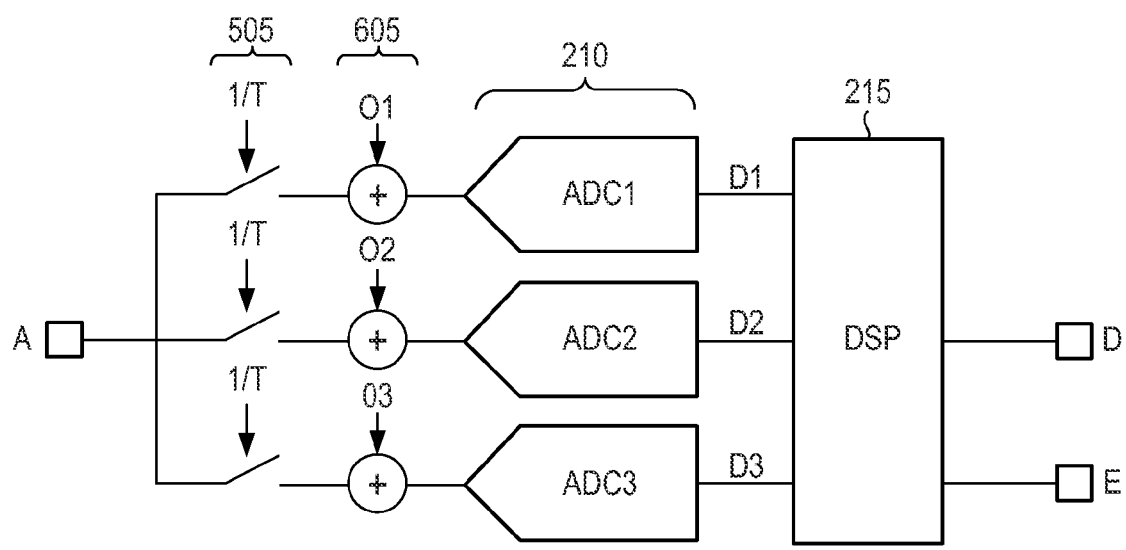
FIG. 7 is a diagram of another ADC comprising three samplers, three offset circuits, three ADCs, and a DSP according to a representative embodiment.

FIG. 7 is a block diagram of an ADC 700 according to a representative embodiment. ADC 700 is similar to ADC 600, except that DSP 215 further outputs an error signal F that can be used by downstream processes to cope with erroneous, unreliable, or less reliable data. For instance, error signal E can indicate the ERROR status shown in decision tree 400 so that a downstream system can discard, ignore, or further process digital output signal D. Alternatively, error signal E can indicate the number of digital samples D1, D2, D3 that were used to generate digital output signal D, which can give an indication of its reliability. For example, error signal E can indicate whether one of digital samples D1 through D3 is identified as an outlier and only two of the digital samples are used to generate digital output signal D, which would somewhat diminish the reliability of digital output signal D.

Upon receiving error signal E in combination with digital output signal D, a downstream system can take measures to address the fact that digital output signal D may be unreliable or erroneous. For example, in response to error signal F indicating an error, the system could perform interpolation between valid samples, it could add a correction term to digital output signal D, or it could simply store data in an error log to indicate the presence of unreliable data.

While representative embodiments are disclosed herein, one of ordinary skill in the art will appreciate that many variations that are in accordance with the present teachings are possible and remain within the scope of the appended claims. The invention therefore is not to be restricted except within the scope of the appended claims.

The invention claimed is:

1. A system for performing analog-to-digital conversion, comprising:
  a sampling unit configured to generate multiple digital samples from an analog input signal at each recurrence of a periodic interval, the sampling unit comprising multiple analog-to-digital converters (ADCs) that operate in parallel to separately receive and digitize the analog input signal to produce the digital samples; and
  a processing unit configured to combine the digital samples to produce a digital output signal, the processing unit configured to determine when any of the digital samples is an outlier by performing a pairwise comparison of the digital samples, identifying a digital sample as an outlier if it differs from each of the other digital samples by more than a predetermined amount and averaging digital samples that are not determined to be outliers.

2. The system of claim 1, wherein the sampling unit further includes a sample and hold (S/H) circuit configured to sample the analog input signal and provide the sampled analog input signal to each of the multiple ADCs.

3. The system of claim 1, wherein the sampling unit further includes multiple sample and hold (S/H) circuits each configured to sample the analog input signal and to provide the sampled analog input signal to a corresponding one of the multiple ADCs.

4. The system of claim 1, further comprising multiple offset circuits each introducing an offset into the analog input signal provided to a corresponding one of the multiple ADCs.

5. The system of claim 1, further comprising multiple offset circuits each configured to introduce an offset into an internal comparator of a corresponding one of the multiple ADCs.

6. The system of claim 1, wherein the processing unit is further configured to produce an error signal indicating a reliability of the digital output signal.

7. The system of claim 6, wherein the error signal indicates a number of outliers among the digital samples.

8. The system of claim 1, wherein the multiple ADCs comprise three ADCs.

9. A method of performing analog to digital conversion, the method comprising:
  sampling and digitizing an analog input signal to generate multiple digital samples at each recurrence of a periodic interval; and
  combining the digital samples to generate a digital output signal, wherein combining the digital samples comprises determining whether any of the digital samples is an outlier by performing a pairwise comparison of the digital samples, identifying a digital sample as an outlier if it differs from each of the other digital samples by more than a predetermined amount, and ignoring any outliers when generating the digital output signal.

10. The method of claim 9, wherein the digital output signal is generated as an average of the digital samples that are not outliers.

11. The method of claim 9, wherein sampling and digitizing the analog input signal comprises:
  transmitting the analog input signal to a plurality of analog to digital converters (ADCs) arranged in parallel.

12. The method of claim 11, wherein sampling and digitizing the analog input signal further comprises:
  transmitting the analog input signal to at least one sample and hold (S/H) circuit and then to the plurality of ADCs.

13. The method of claim 11, further comprising applying a separate voltage offset to the analog input signal as transmitted to each of the ADCs, or to internal comparators of the ADCs.

14. The method of claim 11, further comprising adjusting each of the digital samples according to a calibrated gain or offset of a corresponding one of the ADCs.

15. The method of claim 11, further comprising adjusting each of the digital samples according to a calibrated timing error of a corresponding one of the ADCs.

16. The method of claim 9, further comprising generating an error signal indicating whether any outliers were identified among the digital samples.

* * * * *